(12) United States Patent
Reznicek et al.

(10) Patent No.: US 9,793,113 B2
(45) Date of Patent: Oct. 17, 2017

(54) SEMICONDUCTOR STRUCTURE HAVING INSULATOR PILLARS AND SEMICONDUCTOR MATERIAL ON SUBSTRATE

(71) Applicant: GLOBALFOUNDRIES INC., Grand Cayman (KY)

(72) Inventors: Alexander Reznicek, Troy, NY (US); Dominic J. Schepis, Wappingers Falls, NY (US); Kangguo Cheng, Schenectady, NY (US); Bruce B. Doris, Brewster, NY (US); Pouya Hashemi, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/075,668

(22) Filed: Mar. 21, 2016

(65) Prior Publication Data
US 2017/0271146 A1    Sep. 21, 2017

(51) Int. Cl.
*H01L 21/20* (2006.01)
*H01L 29/78* (2006.01)
(Continued)

(52) U.S. Cl.
CPC ...... *H01L 21/0243* (2013.01); *H01L 21/0237* (2013.01); *H01L 21/0245* (2013.01);
(Continued)

(58) Field of Classification Search
CPC .... H01L 21/0243; H01L 21/02639–21/02642; H01L 21/31; H01L 21/311; H01L 21/02381; H01L 21/02532; H01L 21/02538; H01L 21/02647; H01L 21/02433; H01L 21/02609; H01L 21/02636; H01L 29/66446; H01L 29/66795; H01L 29/785; H01L 29/1054; H01L 29/0649; H01L 29/045; H01L 29/32; H01L 27/0924; H01L 29/165; H01L 21/0245; H01L 21/76224; H01L 21/823431

See application file for complete search history.

(56) References Cited

U.S. PATENT DOCUMENTS 9,318,491 B2 * 4/2016 Cantoro ............ H01L 27/0924
9,443,729 B1 * 9/2016 Duriez ............. H01L 21/02664
(Continued)

FOREIGN PATENT DOCUMENTS

WO    WO 2015099688 A1 * 7/2015 ............ H01L 21/84

*Primary Examiner* — Marvin Payen
*Assistant Examiner* — Jeremy Joy
(74) *Attorney, Agent, or Firm* — Yuanmin Cai; Hoffman Warnick LLC

(57) ABSTRACT

One aspect of the disclosure relates to a method of forming a semiconductor structure. The method may include: forming a set of openings within a substrate; forming an insulator layer within each opening in the set of openings; recessing the substrate between adjacent openings containing the insulator layer in the set of openings to form a set of insulator pillars on the substrate; forming sigma cavities within the recessed substrate between adjacent insulator pillars in the set of insulator pillars; and filling the sigma cavities with a semiconductor material over the recessed substrate between adjacent insulator pillars.

12 Claims, 14 Drawing Sheets

(51) Int. Cl.
| | |
|---|---|
| H01L 21/02 | (2006.01) |
| H01L 21/31 | (2006.01) |
| H01L 21/311 | (2006.01) |
| H01L 29/06 | (2006.01) |
| H01L 29/66 | (2006.01) |
| H01L 27/092 | (2006.01) |
| H01L 29/10 | (2006.01) |
| H01L 29/165 | (2006.01) |
| H01L 21/762 | (2006.01) |
| H01L 21/8234 | (2006.01) |

(52) U.S. Cl.
CPC .. *H01L 21/02532* (2013.01); *H01L 21/02538* (2013.01); *H01L 21/02639* (2013.01); *H01L 21/02647* (2013.01); *H01L 21/31* (2013.01); *H01L 21/311* (2013.01); *H01L 21/76224* (2013.01); *H01L 21/823431* (2013.01); *H01L 27/0924* (2013.01); *H01L 29/0649* (2013.01); *H01L 29/0657* (2013.01); *H01L 29/1054* (2013.01); *H01L 29/165* (2013.01); *H01L 29/66446* (2013.01); *H01L 29/66795* (2013.01); *H01L 29/785* (2013.01)

(56) References Cited

U.S. PATENT DOCUMENTS

| | | | | |
|---|---|---|---|---|
| 2009/0315112 | A1* | 12/2009 | Lee | H01L 21/823431 257/355 |
| 2011/0117730 | A1* | 5/2011 | Wann | H01L 21/02381 438/479 |
| 2012/0241815 | A1* | 9/2012 | Kim | H01L 21/0243 257/190 |
| 2013/0043506 | A1* | 2/2013 | Tsai | H01L 29/66795 257/192 |
| 2013/0234147 | A1* | 9/2013 | Wu | H01L 29/66795 257/76 |
| 2015/0035113 | A1* | 2/2015 | Chen | H01L 29/0649 257/506 |
| 2016/0064522 | A1* | 3/2016 | Tu | H01L 29/41783 257/192 |
| 2016/0308041 | A1* | 10/2016 | Then | H01L 21/84 |

* cited by examiner

SEMICONDUCTOR STRUCTURE HAVING INSULATOR PILLARS AND SEMICONDUCTOR MATERIAL ON SUBSTRATE

BACKGROUND

Technical Field

The present disclosure relates to semiconductors, and more particularly, to semiconductor structures having insulator pillars and a semiconductor material on a substrate, and a method of forming the same.

Related Art

As complementary metal-oxide semiconductor (CMOS) technologies continue to scale down in size, creating smaller semiconductor structures has become more challenging. As a result, alternate semiconductor materials, such as silicon germanium or III-V semiconductors, are being considered as options for advanced technology nodes. One particular challenge related to advanced technology nodes is forming these alternative semiconductor materials directly on a substrate. In particular, due to the lattice mismatch between these semiconductor materials and the substrate, the semiconductor materials may become highly strained as they are grown on the substrate. To overcome this high strain, the semiconductor materials are grown to be very thick, i.e., about 1 micrometer (μm) to 2 μm, to allow relaxation of the alternate semiconductor materials near the substrate. Additionally, the lattice mismatch causes defects to form at an interface of the substrate and the semiconductor material grown thereon. Therefore, the semiconductor material must also be grown to a thickness such that the defects terminate, and at least a portion of the semiconductor material over the defects is defect free.

Aspect ratio trapping (ART) refers to a process by which defects are trapped within trenches within non-crystalline material. ART has been employed to reduce the thickness of the semiconductor material grown on a substrate. ART includes forming a non-crystalline material on substrate and etching trenches within the non-crystalline material. Subsequently, semiconductor material may be formed within the trenches over the substrate. As previously discussed, defects may form between the semiconductor material and substrate. However, since the semiconductor material is formed within the trenches within the non-crystalline material, the defects will terminate at a surface of the non-crystalline material. That is, the defects will be smaller in size due earlier termination within the trenches created during the ART process.

SUMMARY

A first aspect of the disclosure relates to a method of forming a semiconductor structure. The method may include: forming a set of openings within a substrate; forming an insulator layer within each opening in the set of openings; recessing the substrate between adjacent openings containing the insulator layer in the set of openings to form a set of insulator pillars on the substrate; forming sigma cavities within the recessed substrate between adjacent insulator pillars in the set of insulator pillars; and filling the sigma cavities with a semiconductor material over the recessed substrate between adjacent insulator pillars.

A second aspect of the disclosure relates to a method of forming a semiconductor structure. The method may include: forming a set of insulator pillars on a substrate; forming a semiconductor material between adjacent insulator pillars of the set of insulator pillars, wherein a height of the semiconductor material is less than a height of the set of insulator pillars; recessing the set of insulator pillars to a thickness below the height of the semiconductor material; and forming additional semiconductor material over the recessed set of insulator pillars.

A third aspect of the disclosure relates to a semiconductor structure. The semiconductor structure may include: a set of insulator pillars on a substrate; a set of sigma cavities within the substrate, each sigma cavity in the set of sigma cavities being disposed between adjacent insulator pillars on the substrate; and a semiconductor material within the sigma cavities over the substrate between adjacent insulator pillars, wherein the semiconductor material is disposed over each of the insulator pillars and covers sidewalls of each of the insulator pillars.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the invention. In the drawings, like numbering represents like elements between the drawings.

DETAILED DESCRIPTION

The present disclosure relates to semiconductors, and more particularly, to semiconductor structures having insulator pillars and a semiconductor material on a substrate, and a method of forming the same. The semiconductor structures described herein allow for the growth of thinner semiconductor materials over a substrate by including sigma cavities within the substrate and insulator pillars on the substrate for trapping defects created at the interface of the semiconductor material and the substrate. The resulting semicondcutor structures formed using the semiconductor material and substrate as described herein, can result in the formation of additional semiconductor conductor materials thereover. The additional semiconductor materials allow for creation of semiconductor devices, such as field-effect-transistors (FETs).

Figure 1:
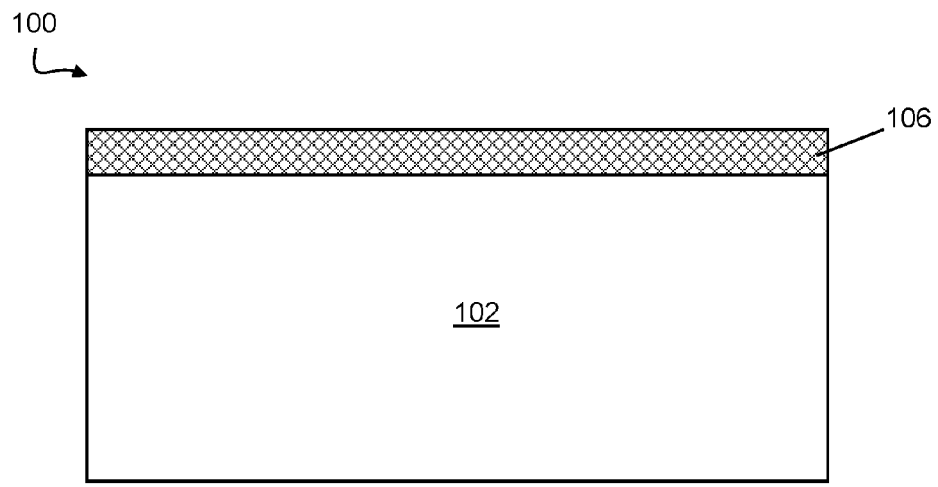
FIGS. 1-5 show a semiconductor structure undergoing preliminary processes of the methods according to embodiments of the disclosure with FIGS. 1-2 and 4-5 showing cross-sectional views of the semiconductor structure and FIGS. 3-4 showing top-down views of the semiconductor structure.

FIG. 1 shows a preliminary semiconductor structure 100 including a substrate 102. Substrate 102 may include but is not limited to silicon, e.g., bulk silicon, silicon germanium, or silicon carbide. Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire substrate 102 may be strained. In some embodiments, substrate 102 may be a bulk silicon substrate or a silicon on insulator layer (SOI) substrate. SOI typically refers to the use of a layered silicon-insulator-silicon substrate in place of a more conventional silicon substrate (bulk substrate) in semiconductor manufacturing, especially microelectronics. SOI-based devices differ from conventional silicon-built devices in that the silicon junction is above an electrical insulator, typically silicon dioxide or (less commonly) sapphire. The choice of insulator depends largely on intended application, with sapphire being used for radiation-sensitive applications and silicon oxide preferred for improved performance and diminished short channel effects in microelectronics devices. The precise thickness of the insulating layer and topmost silicon layer also vary widely with the intended application.

As shown in FIG. 1, a hard mask 106 may be formed, e.g., deposited, over substrate 102. Hard mask 106 may include, for example, a nitride, such as silicon nitride. The term "hard mask" may be given to a layer of material which is applied over an underlying layer of material, and patterned to have openings, so that the underlying layer can be processed where there are openings as will be described herein. It will be understood that when an element as a layer, region or substrate is referred as being "on" or "over" another element, it can be directly on the other element or intervening elements may be present. It will also be understood that when an element is referred to as being "connected" or "coupled" to another element, it can be directly connected or couple to the other element or intervening elements may be present. "Depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
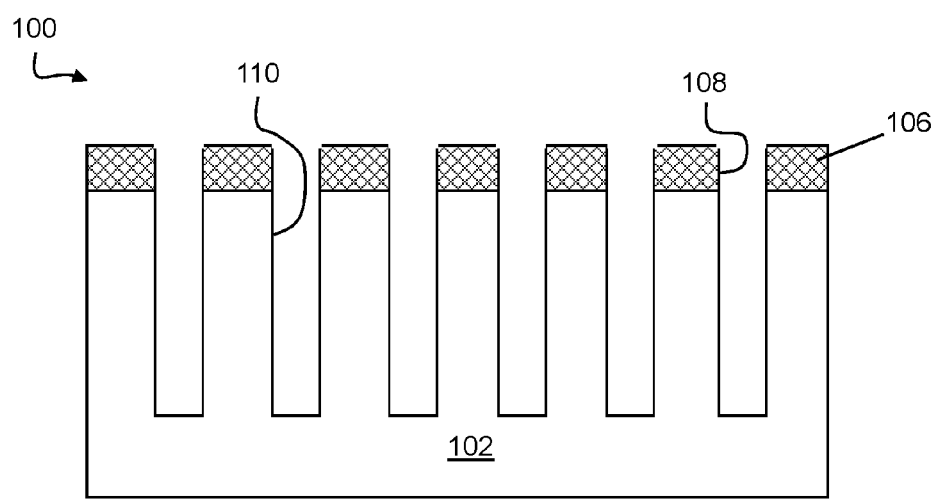

As shown in FIG. 2, openings 110 may be formed in substrate 102. Openings 110 may be formed, for example, by patterning and etching hard mask 106 to form openings 108 to expose portions of substrate 102. The exposed portions of substrate 102 may then be etched to create openings 110 in substrate 102. "Etching" generally refers to the removal of material, e.g., from substrate 102, (or structures formed on the substrate), and is often performed with a mask, e.g., hard mask 106, in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow trench isolation (STI) trenches.

Figure 3:
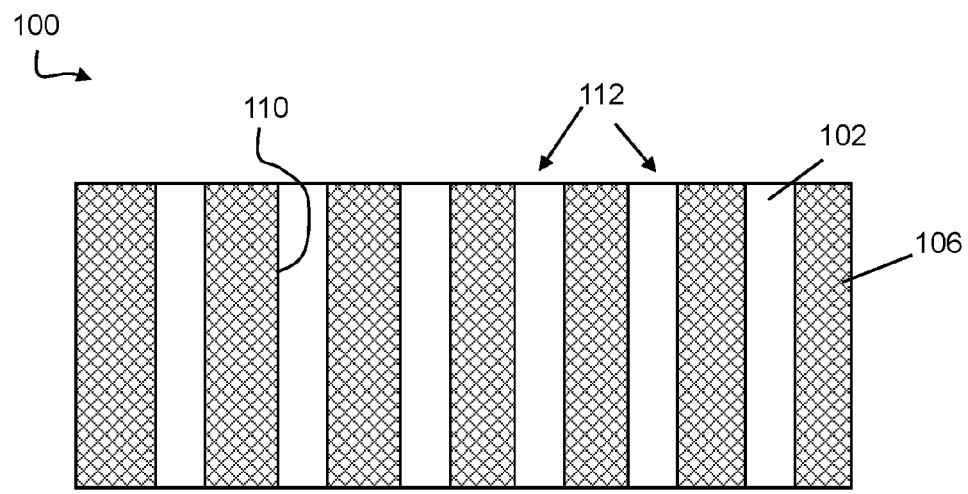
Figure 4:
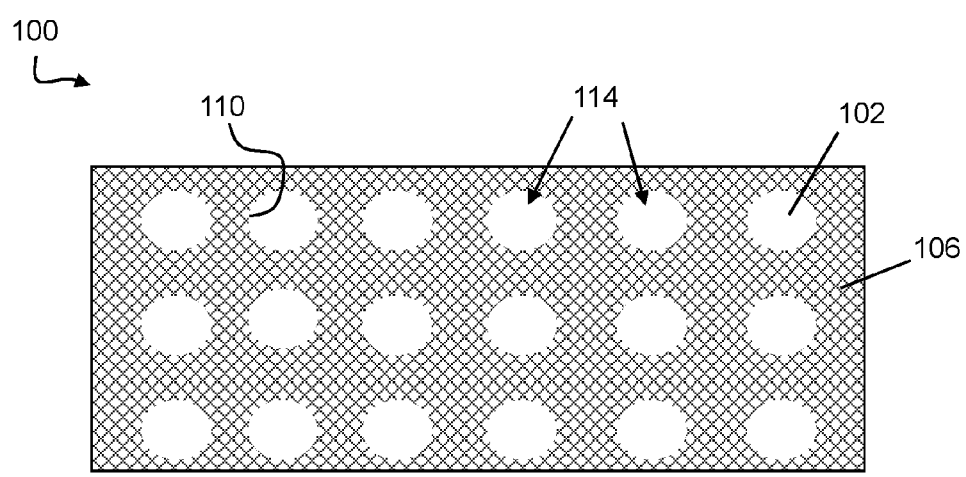
Figure 5:
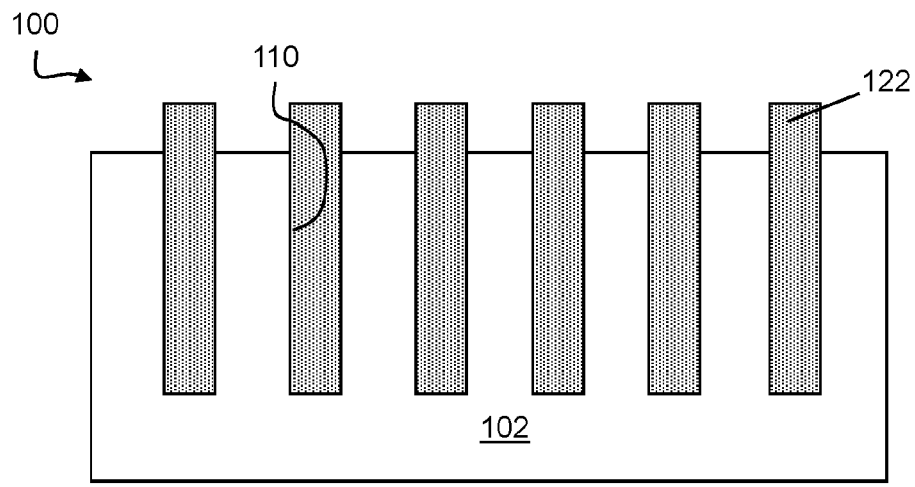

FIGS. 3 and 4 show top-down views of semiconductor structure 100 after openings 110 have been formed. In some embodiments, the forming of openings 110 may include forming trenches 112 (FIG. 3) in substrate 102. In this embodiment, trenches 112 may have a width of approximately 50 nanometers (nm) to approximately 200 nm. In other embodiments, the forming of openings 110 may include forming holes 114 (FIG. 4) in substrate 102. In this embodiment, holes 114 may have a diameter of approximately 50 nanometers (nm) to approximately 200 nm. It is to be understood that openings 110 may have a variety of shapes without departing from aspects of the disclosure. As used herein "approximately" is intended to include values, for example, within 10% of the stated values. Referring now to the cross-sectional view of FIG. 5, after openings 110 are formed, an insulator layer 122 may be formed within each of the openings 110. That is, insulator layer 122 may substantially fill each opening 110. Insulator layer 122 may be formed by, for example, deposition. In some embodiments, insulator layer 122 may include, for example, an oxide, such as silicon dioxide. In other embodiments, insulator layer 122 may include, for example, a nitride, such as silicon nitride. Further, after insulator layer 122 is formed, hard mask 106 (FIG. 2) may be removed, e.g., by etching, leaving a portion of insulator layer 122 extending above substrate 102.

Figure 6:
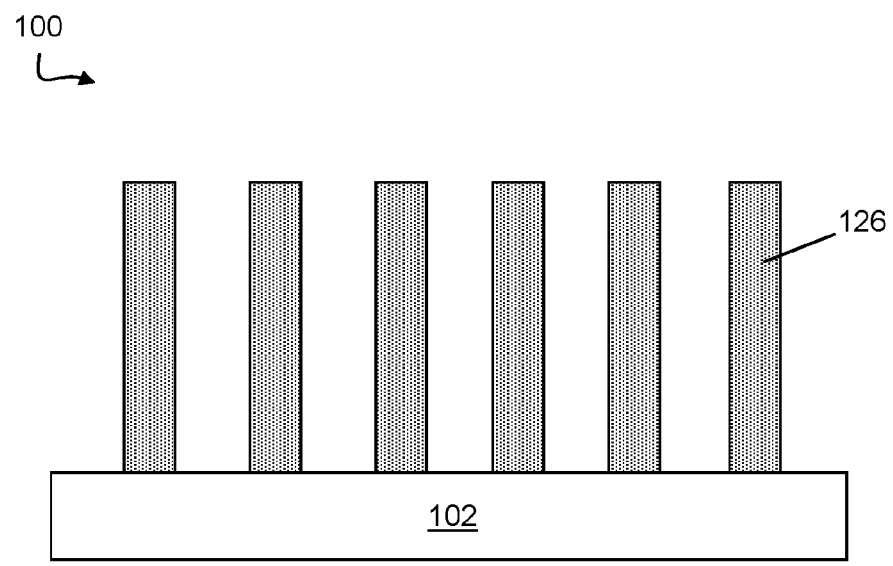
FIGS. 6-12 show the semiconductor structure undergoing processes according to one embodiment of the disclosure with FIGS. 6 and 9-12 showing cross-sectional views of the semiconductor structure and FIGS. 7-8 showing top-down views of the semiconductor structure.

As shown in FIG. 6, substrate 102 may be recessed, e.g., by forming another hard mask (not shown) over insulator layer 122, patterning and etching the hard mask to expose substrate 102 between portions of insulator layer 122, etching the exposed portions of substrate 102, and removing the hard mask from over insulator layer 122. In some embodiments, substrate 102 may be recessed to a depth substantially equal to or matching the depth of insulator layer 122. However, it is to be understood that substrate 102 may be recessed to any desired depth without departing from aspects of the disclosure. As used herein, "substantially" refers to largely, for the most part, entirely specified or any slight deviation which provides the same technical benefits of the invention. Substrate 102 may be recessed such that insulator pillars 126 remain on substrate 102. That is, substrate 102 may be recessed such that insulator layer 122 (FIG. 5) that filled openings 110 (FIG. 5) creates freestanding insulator pillars 126.

Figure 7:
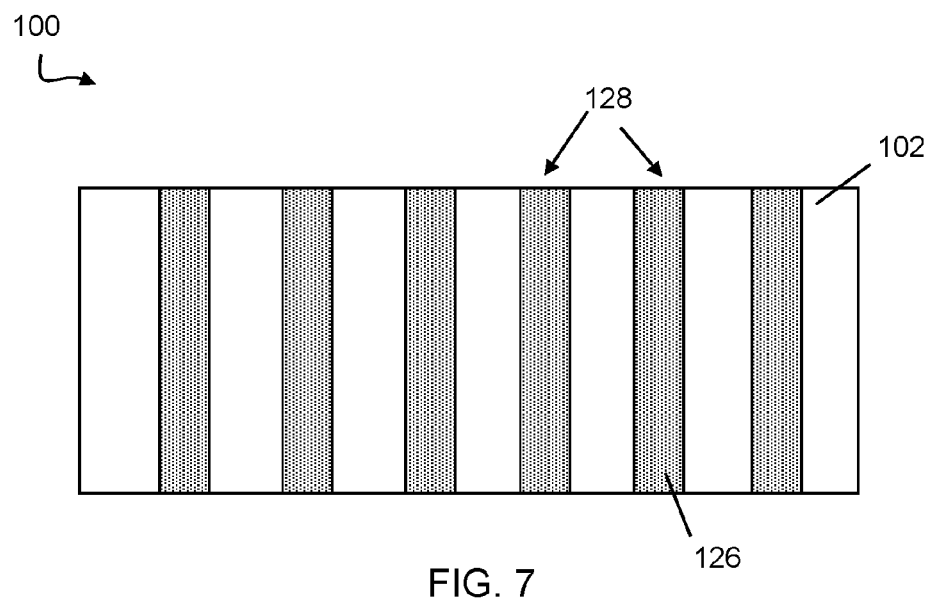
Figure 8:
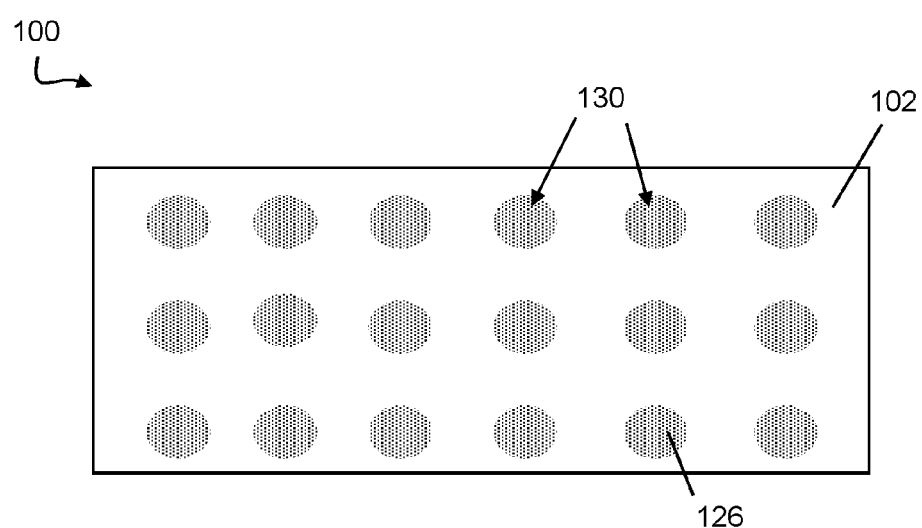

FIG. 7 shows a top-down view of semiconductor structure 100 after insulator pillars 126 are formed according to the embodiment shown in FIG. 3. That is, with respect to the embodiment shown in FIG. 3, insulator pillars 126 may be shaped as fins 128 after filling trenches 112 (FIG. 3) as shown in FIG. 7. FIG. 8 shows a top-down view of semiconductor structure 100 after insulator pillars 126 are formed according to the embodiment shown in FIG. 4. With respect to the embodiment shown in FIG. 4, insulator pillars 126 may be shaped as columns 130 after filling holes 114 (FIG. 4) as shown in FIG. 8. As used herein, "insulator pillars" refer to insulator pillars 126 shaped either as fins 128 (FIG. 7) or columns 130 (FIG. 8). However, it is to be understood that insulator pillars 126 may be of any shape corresponding the shape of openings 110.

Figure 9:
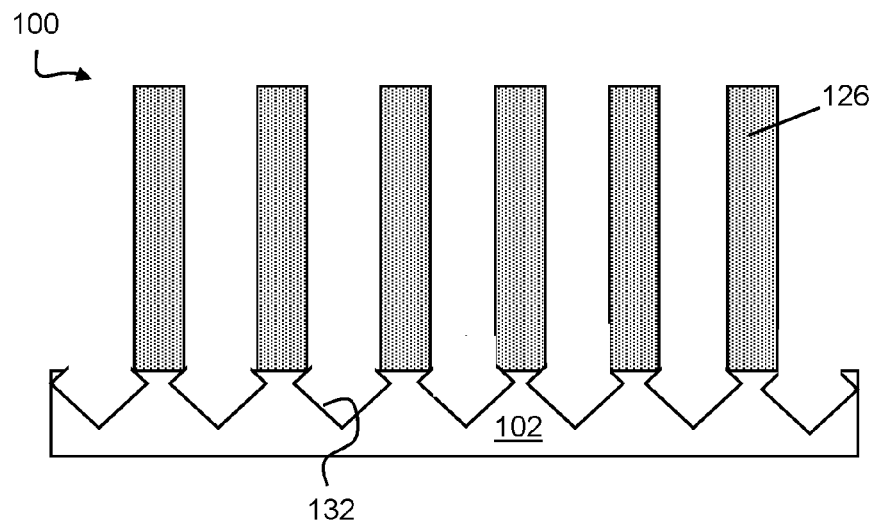

Referring now to FIG. 9, sigma cavities 132 may be formed in recessed substrate 102. That is, sigma cavities 132 may be formed within substrate 102 between adjacent insulator pillars 126. Sigma cavities 132 are so named due to their configuration or shape caused by etch rates. As used herein "sigma cavities" refer to openings having a cross-section that is substantially diamond-shaped. That is, each sidewall of sigma cavities 132 may include a first sidewall surface extending from the upper surface of substrate 102 to an apex of each sigma cavity 132. Additionally, each sidewall of sigma cavities 132 may include a second sidewall surface extending from the apex of each sigma cavity 132 to bottom surface of each sigma cavities 132. Sigma cavities 132 may be formed by first etching an initial opening (not shown), e.g., via reactive-ion etching, in substrate 102 between adjacent insulator pillars 126. Subsequently, the opening may be extended, e.g., via wet etching, to form a sigma shape, thereby forming sigma cavities 132. In another embodiment, sigma cavities 132 may be formed via a gas etch, such as a hydrogen chloride gas etch without bias, or with no electrical field applied. In other embodiments, a single wet etch may be employed, such as a wet etch using ammonium hydroxide or tetra-methyl ammonium hydroxide.

Figure 10:
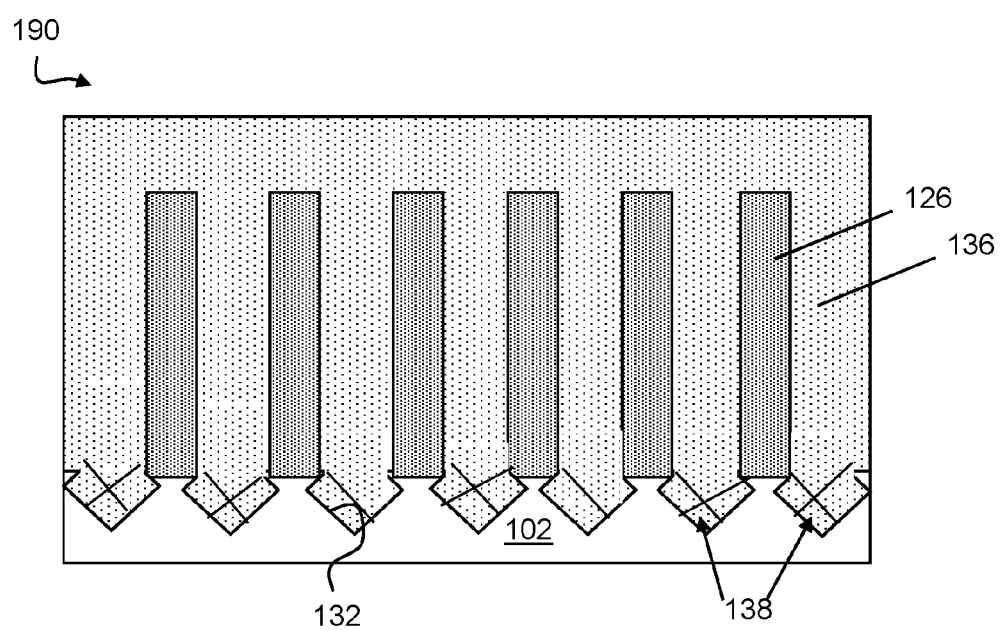

As shown in FIG. 10, after sigma cavities 132 are formed, a semiconductor material 136 may be formed within sigma cavities 132 and may extend along sidewalls of insulator pillars 126 and over an upper surface of insulator pillars 126 such that insulator pillars 126 are substantially surrounded by and are within semiconductor material 136. Consequently, in this embodiment, semiconductor material 136 may have a thickness which is greater than a thickness of insulator pillars 126. Semiconductor material 136 may be formed, for example, by epitaxial growth. The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface, e.g., substrate 102. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. In some embodiments, epitaxial growth and/or deposition processes may be selective to forming on semiconductor surfaces, and may not deposit material on dielectric surfaces, such as silicon dioxide or silicon nitride surfaces. Crystal orientations are generally represented by Miller indices. Miller indices describe the position and orientation of a crystal plane using coordinates of non-colinear atoms lying in the plane. Miller indices are determined by determining the intercepts on three basis axes, e.g., x, y, and z axes, in terms of the lattice constant of the material.

Semiconductor material 136 may include, for example, silicon, silicon germanium or a III-V semiconductor material, such as for example, gallium arsenide, gallium phosphide, gallium antimonide, gallium nitride, indium arsenide, indium phosphide, indium antimonide, indium nitride, aluminum arsenide, aluminum phosphide, aluminum antimonide, aluminum nitride, and/or their ternary or quaternary compounds. As known in the art, these materials have a larger lattice constant at a given temperature than substrate 102. Therefore, there is a lattice mismatch between semiconductor material 136 and substrate 102 which leads to high strains in semiconductor material 136 if it is grown directly on substrate 102. These high strains cause defects 138 at an interface of semiconductor material 136 and substrate 102. However, since the interface of semiconductor material 136 and substrate 102 is disposed within sigma cavities 132, defects 138 are maintained within sigma cavities 132 and do not affect or otherwise damage insulator pillars 126. Since defects 138 are maintained within sigma cavities 132, semiconductor material 136 may have a thickness that is approximately 100 nanometers (nm) to approximately 200 nm, which is substantially thinner than the thickness of semiconductor materials grown directly on a substrate known in the art.

Still referring to FIG. 10, the resulting semiconductor structure 190 after semiconductor material 136 is formed may include insulator pillars 126 on substrate 102 and sigma cavities 132 within substrate 102. Each sigma cavity 132 may be disposed between adjacent insulator pillars 126 on substrate 102. Additionally, semiconductor material 136 may be disposed within sigma cavities 132 and substantially surrounding insulator pillars 126 on substrate 102. Further, semiconductor structure 190 may also include defects 138 within sigma cavities 132 at an interface of semiconductor material 136 and substrate 102.

Figure 11:
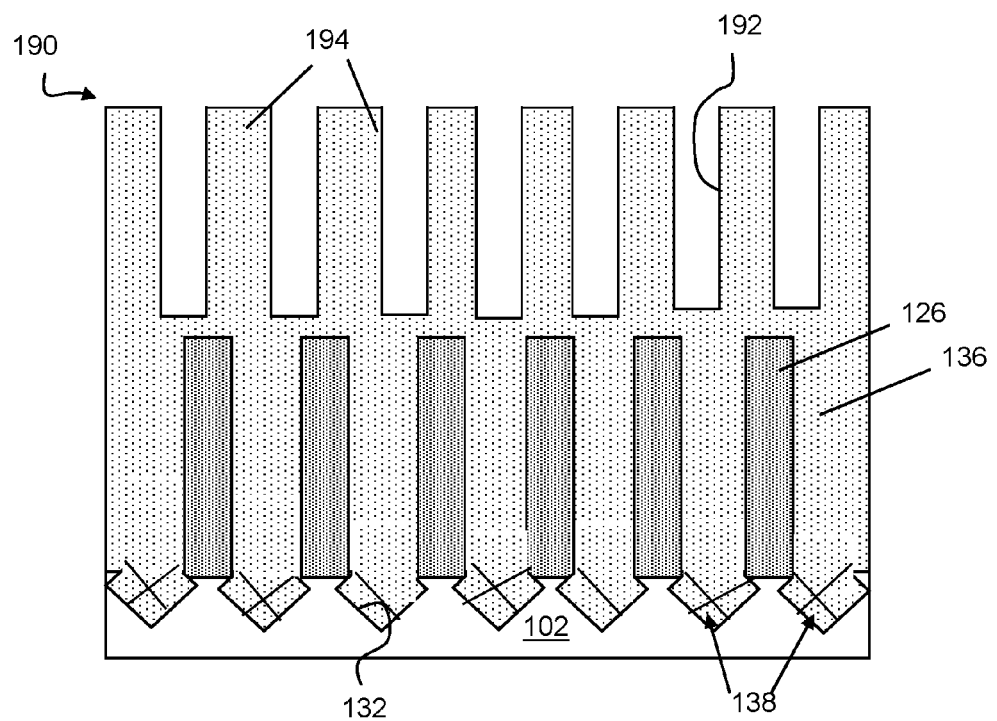

Semiconductor structure 190 can facilitate the formation of additional semiconductor materials and semiconductor devices thereover. That is, additional layers of silicon germanium or III-V semiconductor materials may be formed over substrate 102 on semiconductor structure 190 to create semiconductor devices, e.g., FETs. For example, with respect to a fin-shaped FET (FINFET) it may be desirable to form semiconductor fins out of semiconductor material 136 (or the additional layers of silicon germanium or III-V semiconductor materials formed thereover) on a substrate 102 as opposed to forming the fins from a substrate as is conventionally done. To reduce the overall thickness of the semiconductor fins in the FINFET, semiconductor structure 190 may be employed beneath the FINFET to enable relaxed, defect-free semiconductor fins over substrate 102. The FINFETs that are formed over semiconductor structure 190 can take place in several forms. In one embodiment, a mask (not shown) may be patterned over semiconductor material 136 to expose portions of semiconductor material 136. Openings 192 may be formed, e.g., via etching, into the top surface of semiconductor material 136 to form fins 194 as shown in FIG. 11. In this case, the overgrowth of the semiconductor material 136 compared to the height of insulator pillars 126 should be substantially higher than the desired height of fins 194. For example, if fins 194 are to be 40 nm high (tall), then the growth of semiconductor material 136 must be greater than 40 nm higher than the top surface of insulator pillars 126. In one example, the thickness of semiconductor material 136 can be twice the height of the intended fin height and then a chemical mechanical polish (CMP) may be done to the top surface of semiconductor material 136 to ensure a smooth surface for which to etch openings 192 for fins 194.

Figure 12:
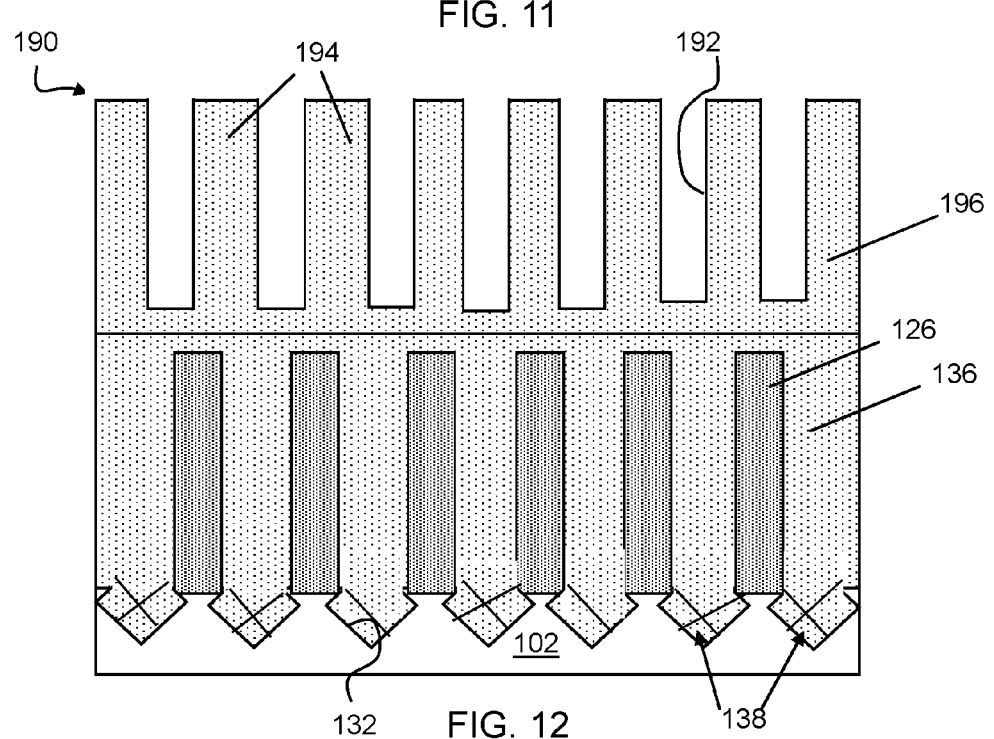

In an embodiment alternative to that shown in FIG. 11, another semiconductor layer 196, such as silicon or silicon germanium, can be grown over semiconductor material 136 as shown in FIG. 12. Semiconductor layer 196 may include any material listed relative to semiconductor material 136. For example, semiconductor material 136 may include relaxed silicon germanium and semiconductor layer 196 may include a thin silicon layer epitaxially grown over the top surface of semiconductor material 136. In such an embodiment, semiconductor layer 196 would become a strained silicon layer, which could be desirable for certain FINFET devices. In this case, the thickness of semiconductor layer 196 would be thick enough to form a fin of, for example, 40 nm high, and semiconductor layer 136 would need to be only thick enough to fully cover insulating pillars 126 such that semiconductor layer 196 is formed on a continuous layer of semiconductor material 136. Additionally, openings 192 may be formed, e.g., via etching, in semiconductor layer 196 to form fins 194. It is to be understood that in either embodiment, any number and orientation of fins may be employed without departing from the disclosure. For example, fins 194 may be formed parallel to pillars 126 (shown in FIGS. 11-12) or fins 194 may be formed perpendicular to pillars 126 (not shown).

Figure 13:
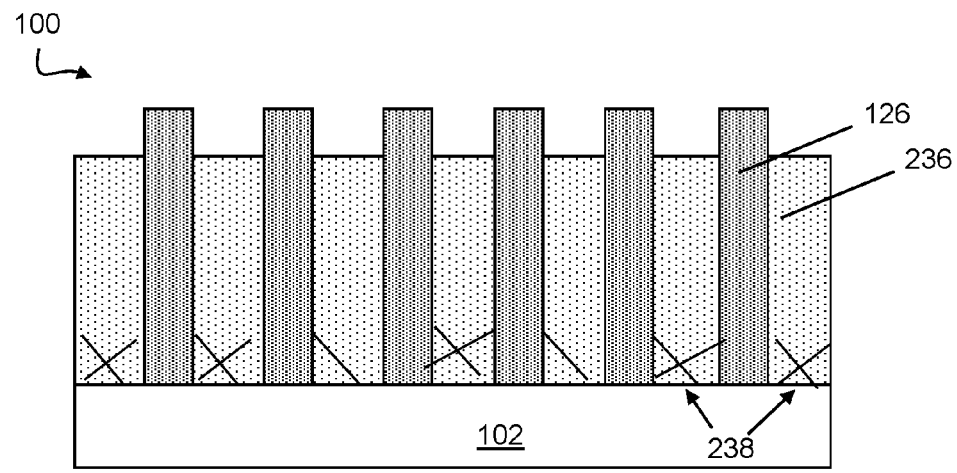
FIGS. 13-19 show cross-sectional views of the semiconductor structure undergoing processes according to another embodiment of the disclosure.

FIGS. 13-19 show processes according to another embodiment of the disclosure, alternative to that of FIGS. 9-10. In this embodiment, after substrate 102 has been recessed as shown in FIG. 6, a semiconductor material 236 may be formed on substrate 102 between insulator pillars 126 as shown in FIG. 13. Semiconductor material 236 may be formed, e.g., epitaxially grown, directly on substrate 102. In this embodiment, semiconductor material 236 may be grown to a thickness which is less than a thickness or height of insulator pillars 126. Semiconductor material 236 may include any of the semiconductor materials discussed relative to semiconductor material 136 (FIG. 10). In one example, where semiconductor material 236 includes silicon germanium, the silicon germanium may be relaxed silicon germanium having a germanium content of approximately 50%. As shown in FIG. 13, defects 238 may be formed at an interface of semiconductor material 236 and substrate 102 due to the lattice mismatch between semiconductor material 236 and substrate 102 as discussed herein. Defects 238 may be trapped by insulator pillars 126.

Figure 14:
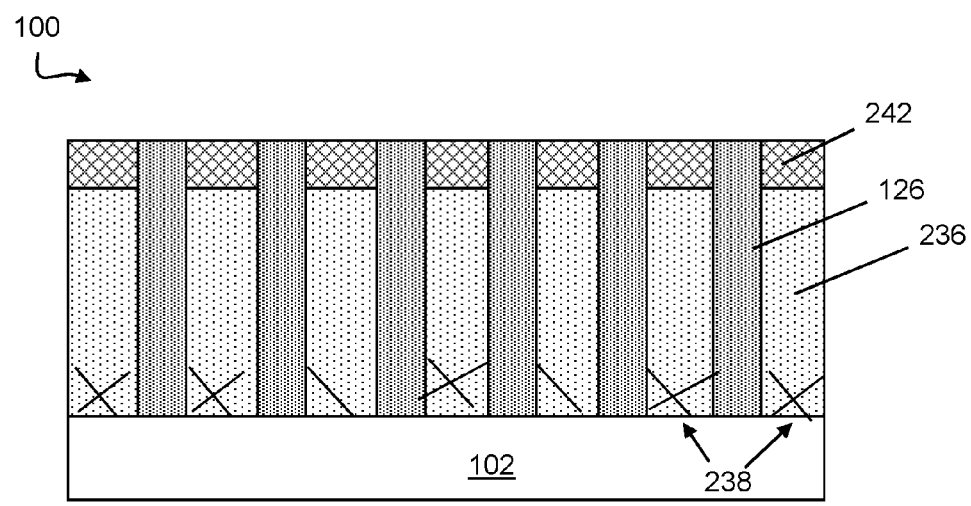
Figure 15:
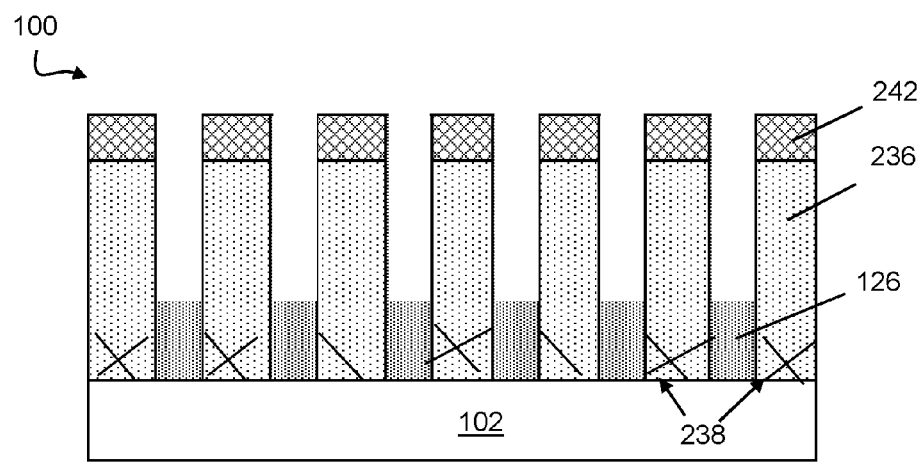

Referring now to FIG. 14, a hard mask 242 may be formed, e.g., deposited, over semiconductor material 236 and insulator pillars 126, and patterned to expose a top surface of insulator pillars 126. As shown in FIG. 15, insulator pillars 126 may be recessed, e.g., via etching, such that insulator pillars 126 have a thickness that is less than a thickness of semiconductor material 236.

Figure 16:
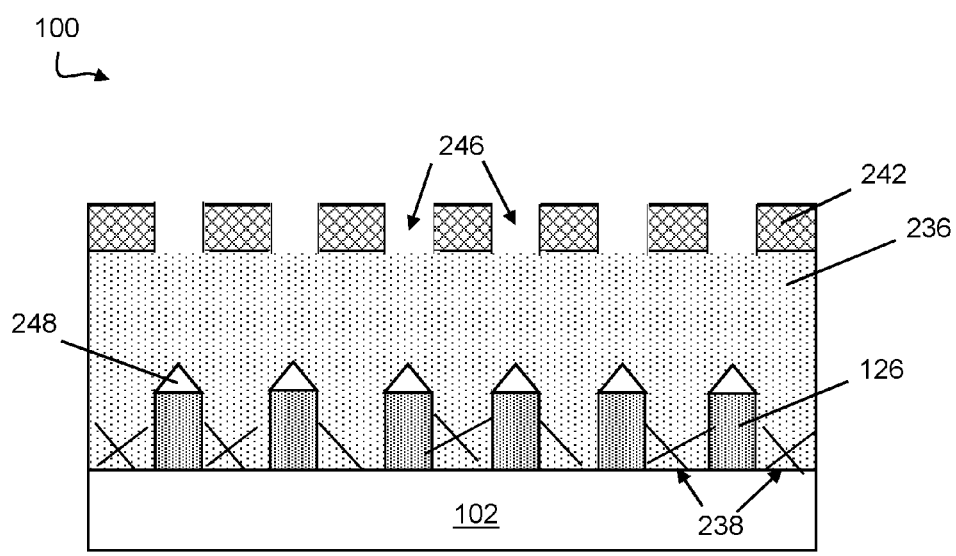

Referring now to FIG. 16, additional semiconductor material 246 may be formed, e.g., epitaxially grown, over recessed insulator pillars 126. However, due to the characteristics of additional semiconductor material 246, additional semiconductor material 246 does not grow/form on insulator materials, e.g., insulator pillars 126, and will only grow from other exposed semiconductor materials, e.g., semiconductor material 236. As shown, additional semiconductor material 246 is grown laterally from semiconductor material 236 already present that was protected by hard mask 242. Since additional semiconductor material 246 will not grow directly on insulator pillars 126, voids 248 are created at an upper surface of insulator pillars 126 between insulator pillars 126 and additional semiconductor material 246. Additional semiconductor material 246 may be formed such that it is uniform with semiconductor material 236. That is, semiconductor material 246 may be formed such that if forms a homogeneous crystal with semiconductor material 236.

Figure 17:
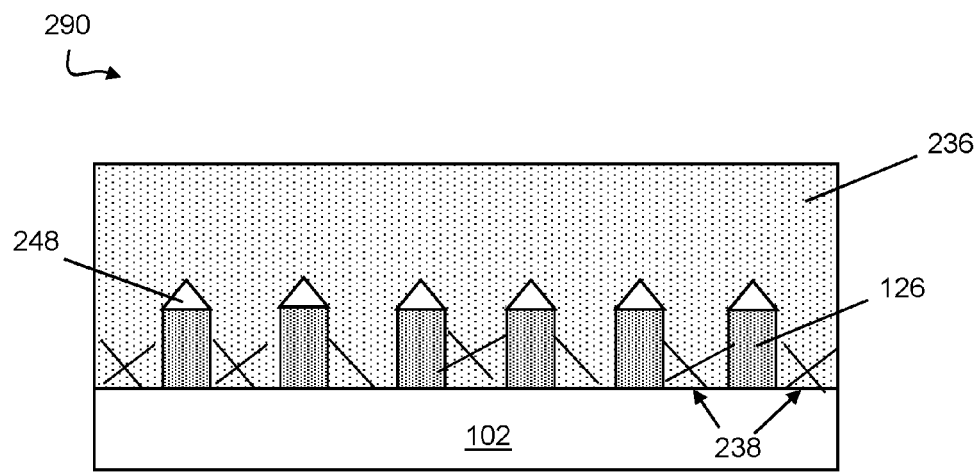

Referring now to FIG. 17, hard mask 242 (FIG. 16) may be removed to expose semiconductor material 236 thereunder. The resulting semiconductor structure 290 after hard mask 242 is removed may include insulator pillars 126 on substrate 102. Semiconductor materials 236, 246 (FIG. 16) may be disposed on substrate 102 between adjacent insulator pillars 126 and over insulator pillars 126 such that insulator pillars 126 are substantially within and surrounded by semiconductor materials 236, 246. As shown, voids 248 may be disposed between insulator pillars 126 and semiconductor material 236 (including semiconductor material 246) at an upper surface of insulator pillars 126. Semiconductor material 236 (including additional semiconductor material 246) may have a thickness of approximately 100 nm to approximately 200 nm, which is substantially thinner than the thickness of semiconductor materials grown directly on a substrate known in the art. Further, semiconductor structure 290 may include defects 238 disposed at an interface of semiconductor material 236 and substrate 102 due to the lattice mismatch between semiconductor material 236 and substrate 102 as discussed herein.

Figure 18:
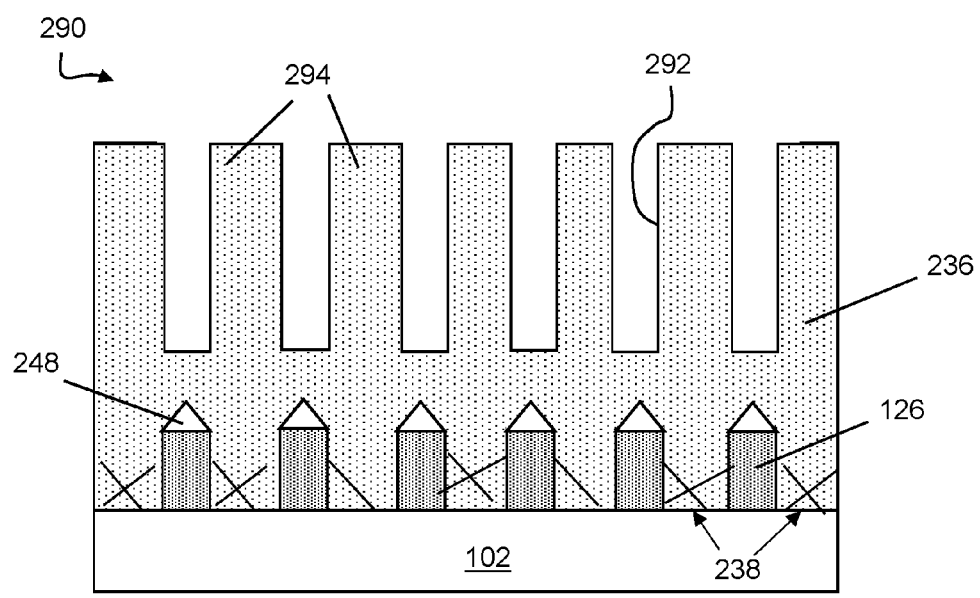

Semiconductor structure 290 can facilitate the formation of additional semiconductor materials (not shown) and semiconductor devices thereover. That is, additional layers of silicon germanium or III-V semiconductor materials may be formed over substrate 102 on semiconductor material 290 to create semiconductor devices, e.g., FETs. For example, with respect to a FINFET it may be desirable to form semiconductor fins out of semiconductor material on a substrate as opposed to forming the fins from a substrate as is conventionally done. To reduce the overall thickness of the semiconductor fins in the FINFET, semiconductor structure 290 may be employed beneath the FINFET to enable relaxed, defect-free semiconductor fins over substrate 102. The FINFETs that are formed over semiconductor structure 290 can take place in several forms. In one embodiment, a mask (not shown) may be patterned over semiconductor material 236 to expose portions of semiconductor material 236. Openings 292 may be formed, e.g., via etching, into the top surface of semiconductor material 236 to form fins 294 as shown in FIG. 18. In this case, the overgrowth of the semiconductor material 236 compared to the height of insulator pillars 126 should be substantially higher than the desired height of fins 294. For example, if fins 294 are to be 40 nm high (tall), then the growth of semiconductor material 236 must be greater than 40 nm higher than the top surface of insulator pillars 126. In one example, the thickness of semiconductor material 236 can be twice the height of the intended fin height and then a chemical mechanical polish (CMP) may be done to the top surface of semiconductor material 236 to ensure a smooth surface for which to etch openings 292 for fins 294.

Figure 19:
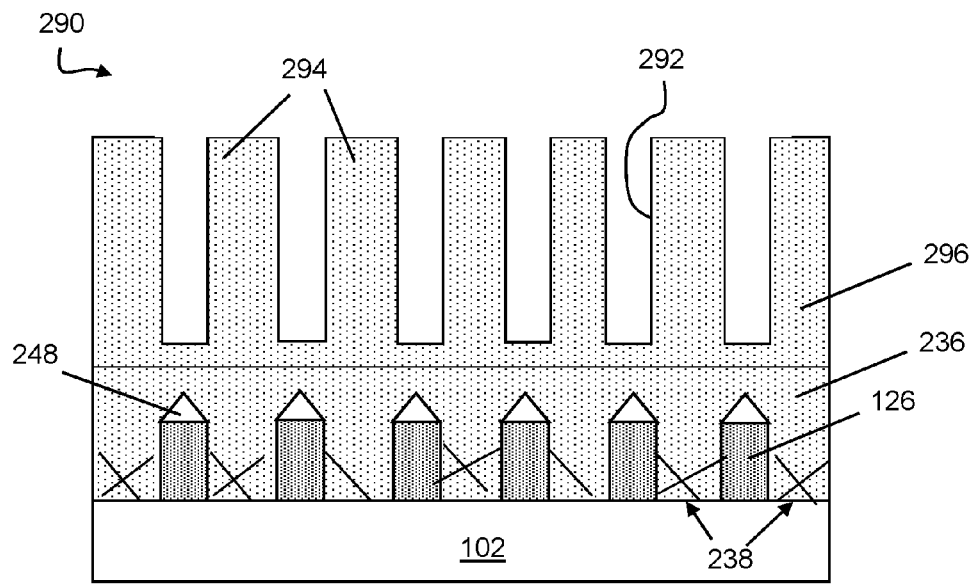

In an embodiment alternative to that shown in FIG. 18, another semiconductor layer 296, such as silicon or silicon germanium, can be grown over semiconductor material 236 as shown in FIG. 19. Semiconductor layer 296 may include any material listed relative to semiconductor material 136 (FIG. 10). For example, semiconductor material 236 may include relaxed silicon germanium and semiconductor layer 296 may include a thin silicon layer epitaxially grown over the top surface of semiconductor material 236. In such an embodiment, semiconductor layer 296 would become a strained silicon layer, which could be desirable for certain FINFET devices. In this case, the thickness of semiconductor layer 296 would be thick enough to form a fin of, for example, 40 nm high, and semiconductor layer 236 would need to be only thick enough to fully cover insulating pillars 126 such that semiconductor layer 296 is formed on a continuous layer of semiconductor material 236. Additionally, openings 292 may be formed, e.g., via etching, in semiconductor layer 296 to form fins 294. For example, fins 294 may be formed parallel to pillars 126 (shown in FIGS. 18-19) or fins 294 may be formed perpendicular to pillars 126 (not shown).

Figure 20:
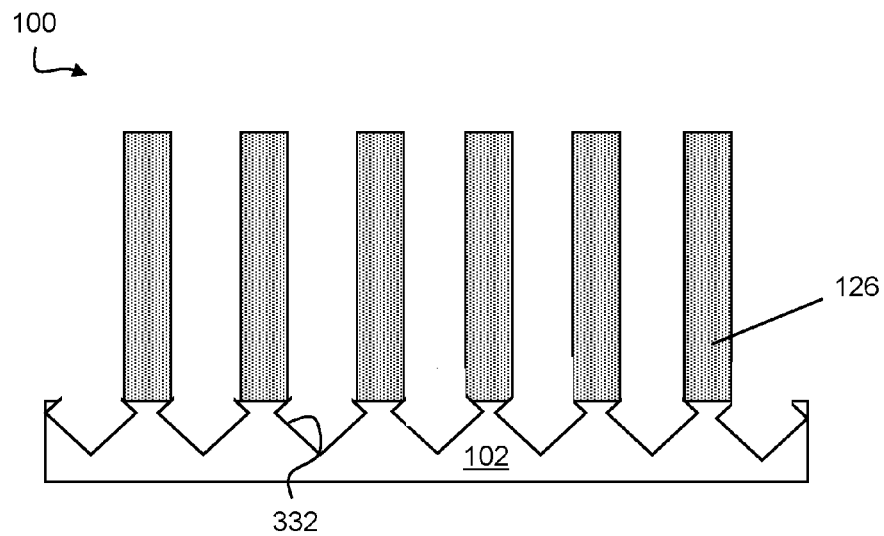
FIGS. 20-27 show cross-sectional views of the semiconductor structure undergoing processes according to another embodiment of the disclosure.
Figure 21:
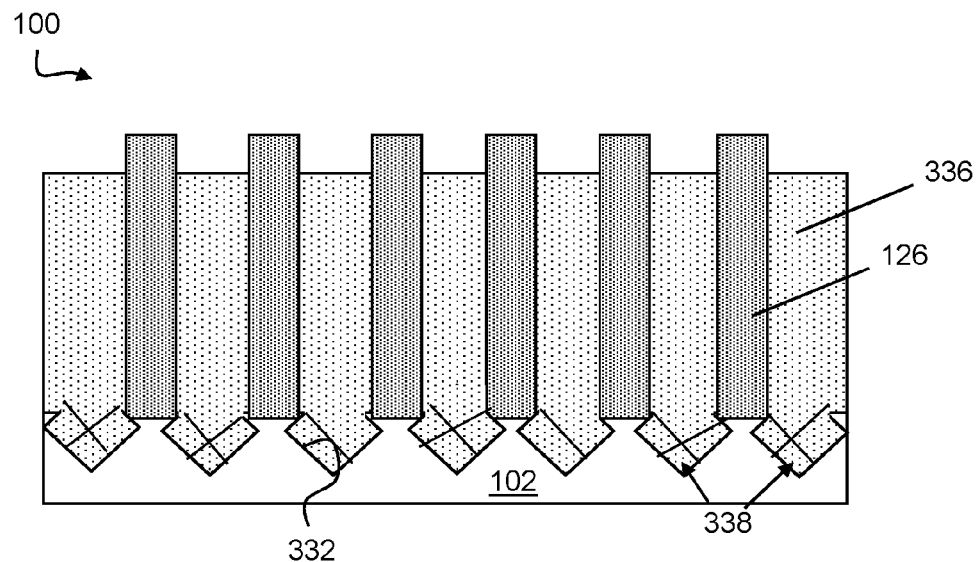

FIGS. 20-27 show processes according to another embodiment of the disclosure, wherein the previous two embodiments are combined. Referring to FIG. 20, in this embodiment, after substrate 102 has been recessed as shown in FIG. 6, sigma cavities 332 may be formed as described with respect to FIG. 9. That is, sigma cavities 332 may be formed within substrate 102 between adjacent insulator pillars 126 as shown in FIG. 20. Subsequently, semiconductor material 336 may be formed over substrate 102 within sigma cavities 332 between insulator pillars 126 as shown in FIG. 21. Semiconductor material 336 may be formed, e.g., epitaxially grown, directly on substrate 102. In this embodiment, semiconductor material 336 may be grown to a thickness which is less than a thickness of insulator pillars 126. Semiconductor material 336 may include any of the semiconductor materials discussed relative to semiconductor material 136 (FIG. 10). In one example, where semiconductor material 336 includes silicon germanium, the silicon germanium may be relaxed silicon germanium having a germanium content of approximately 50%. As shown in FIG. 21, defects 338 may be formed at an interface of semiconductor material 236 and substrate 102 due to the lattice mismatch between semiconductor material 236 and substrate 102 as discussed herein. Defects 338 are maintained within sigma cavities 332 as discussed with reference to FIG. 10.

Figure 22:
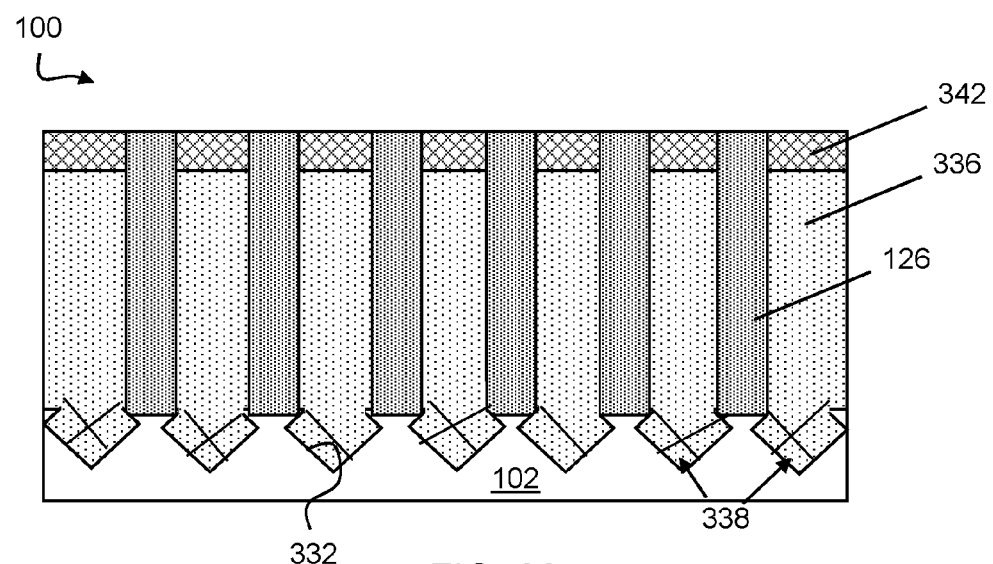
Figure 23:
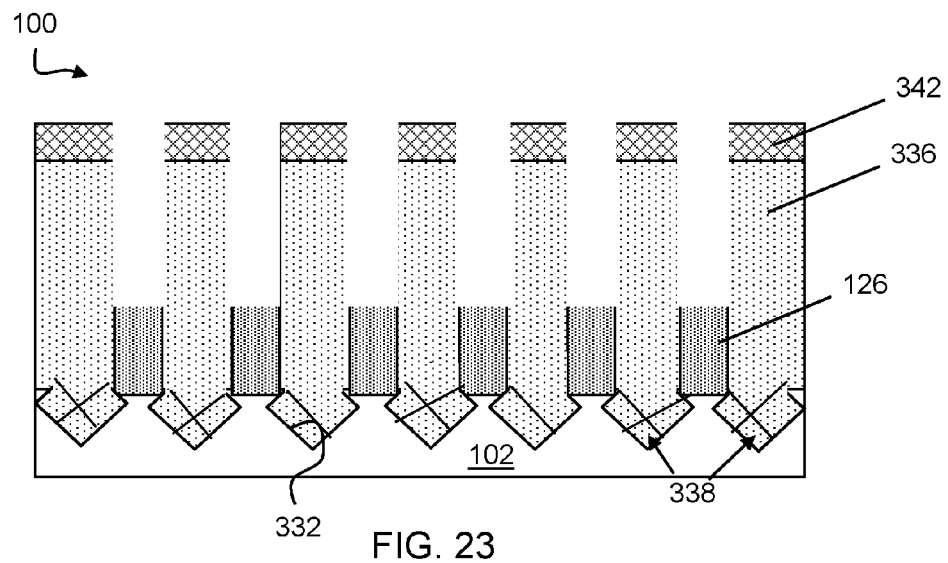

Referring now to FIG. 22, a hard mask 342 may be formed over semiconductor material 336 and insulator pillars 126. Hard mask 342 may be patterned and etched to expose insulator pillars 126. Referring now to FIG. 23, insulator pillars 126 may be recessed, e.g., via etching, such that insulator pillars 126 have a thickness that is less than a thickness of semiconductor material 336.

Figure 24:
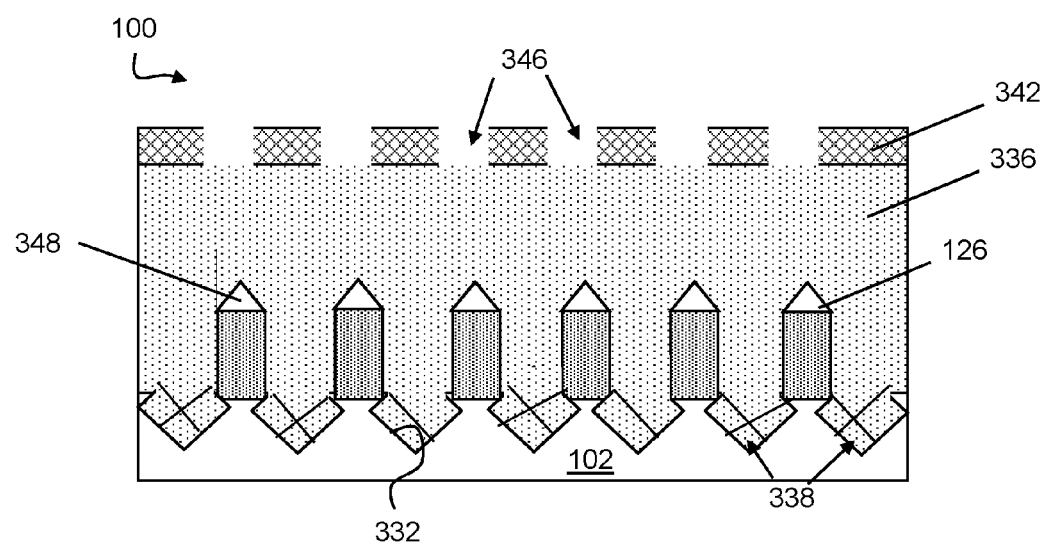
Figure 25:
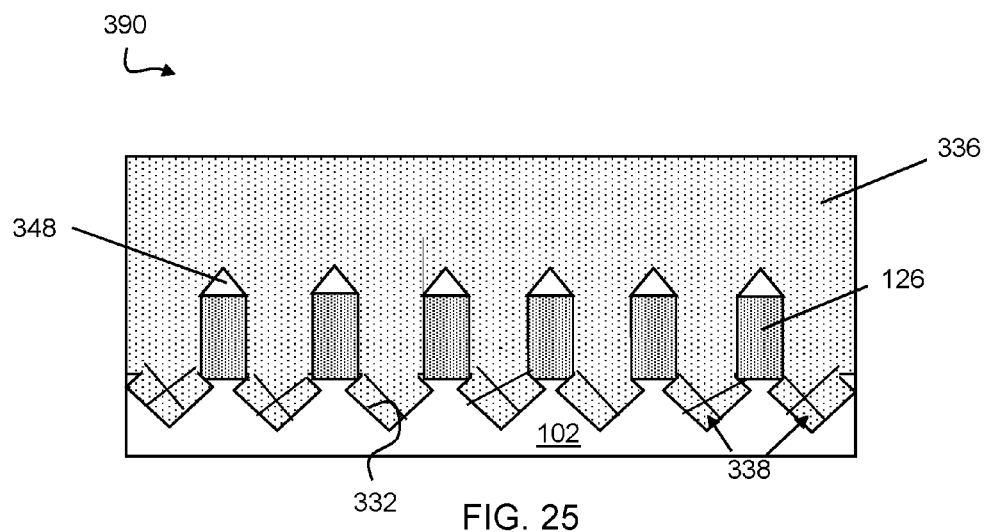

As shown in FIG. 24, additional semiconductor material 346 may be formed, e.g., epitaxially grown, over recessed insulator pillars 126. As shown, additional semiconductor material 346 is grown laterally from semiconductor material 336 already present that was protected by hard mask 342. That is, additional semiconductor material 346 will not grow directly on insulator pillars 126. This lateral growth results in voids 348 being formed at an upper surface of insulator pillars 126 between insulator pillars 126 and additional semiconductor material 346. Additional semiconductor material 346 may be formed such that it is uniform with semiconductor material 336.

Referring now to FIG. 24, hard mask 342 (FIG. 22) may be removed to expose semiconductor layers 336, 346 (FIG. 24) thereunder. The resulting semiconductor structure 390 after the removal of hard mask 342 may include insulator pillars 126 on substrate 102 and sigma cavities 332 within substrate 102. Each sigma cavity 332 may be disposed between adjacent insulator pillars 126 on substrate 102. Additionally, semiconductor material 336 may be disposed within sigma cavities 332 between adjacent insulator pillars 126, such that insulator pillars 126 are substantially within and surrounded by semiconductor materials 336, 346. As shown, voids 348 may be disposed between insulator pillars 126 and semiconductor material 346 at an upper surface of insulator pillars 126. Semiconductor material 336 (including additional semiconductor material 346) may have a thickness of approximately 100 nm to approximately 200 nm, which is substantially thinner than the thickness of semiconductor materials grown directly on a substrate known in the art. Further, semiconductor structure 390 may include defects 338 disposed at an interface of semiconductor material 336 and substrate 102 due to the lattice mismatch between semiconductor material 336 and substrate 102 as discussed herein. As in the embodiment shown in FIG. 10, defects 338 are maintained within sigma cavities 332.

Figure 26:
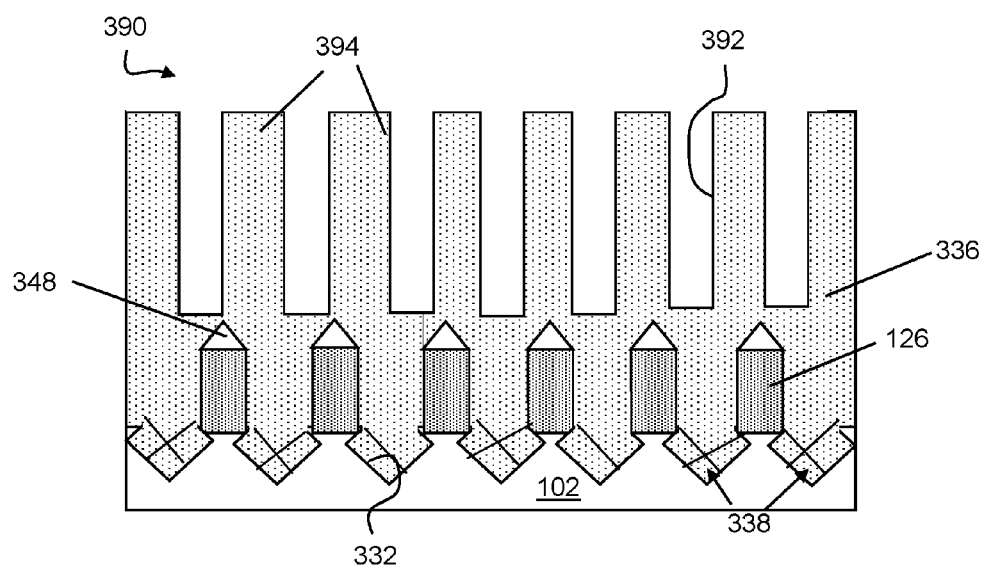

Semiconductor structure 390 can facilitate the formation of additional semiconductor materials (not shown) and semiconductor devices thereover. That is, additional layers of silicon germanium or III-V semiconductor materials may be formed over substrate on semiconductor material 390 to create semiconductor devices, e.g., FETs. For example, with respect to a FINFET it may be desirable to form semiconductor fins out of semiconductor material on a substrate as opposed to forming the fins from a substrate as is conventionally done. To reduce the overall thickness of the semiconductor fins in the FINFET, semiconductor structure 390 may be employed beneath the FINFET to enable relaxed, defect-free semiconductor fins over substrate 102. The FINFETs that are formed over semiconductor structure 390 can take place in several forms. In one embodiment, a mask (not shown) may be patterned over semiconductor material 336 to expose portions of semiconductor material 336. Openings 392 may be formed, e.g., via etching, into the top surface of semiconductor material 336 to form fins 394 as shown in FIG. 26. In this case, the overgrowth of the semiconductor material 336 compared to the height of insulator pillars 126 should be substantially higher than the desired height of fins 394. For example, if fins 394 are to be 40 nm high (tall), then the growth of semiconductor material 336 must be greater than 40 nm higher than the top surface of insulator pillars 126. In one example, the thickness of semiconductor material 336 can be twice the height of the intended fin height and then a chemical mechanical polish (CMP) may be done to the top surface of semiconductor material 336 to ensure a smooth surface for which to etch openings 392 for fins 394.

Figure 27:
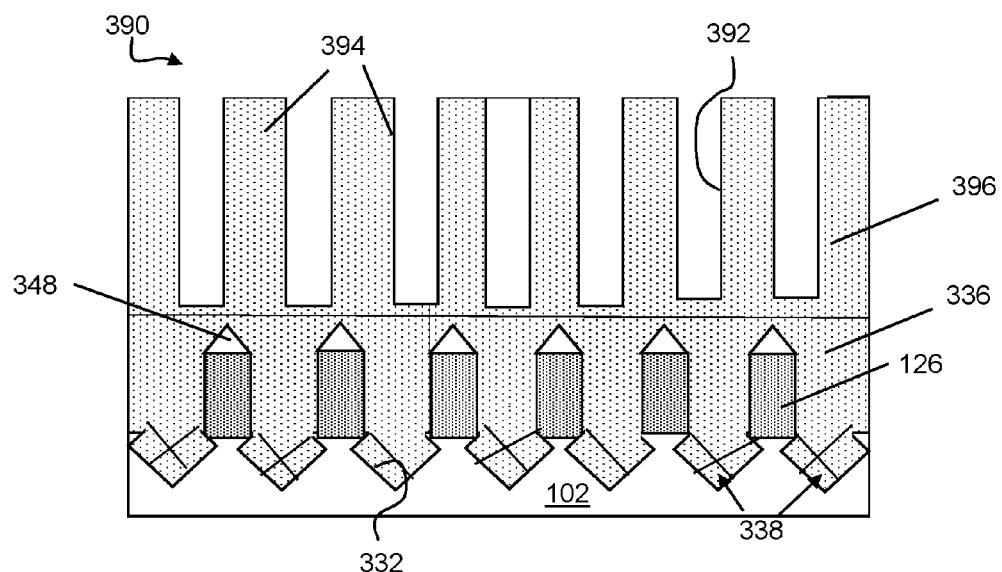

In an embodiment alternative to that shown in FIG. 26, another semiconductor layer 396, such as silicon or silicon germanium, can be grown over semiconductor material 336 as shown in FIG. 27. Semiconductor layer 396 may include any material listed relative to semiconductor material 136 (FIG. 10). For example, semiconductor material 336 may include relaxed silicon germanium and semiconductor layer 396 may include a thin silicon layer epitaxially grown over the top surface of semiconductor material 336. In such an embodiment, semiconductor layer 396 would become a strained silicon layer, which could be desirable for certain FINFET devices. In this case, the thickness of semiconductor layer 396 would be thick enough to form a fin of, for example, 40 nm high, and semiconductor layer 336 would need to be only thick enough to fully cover insulating pillars 126 such that semiconductor layer 396 is formed on a continuous layer of semiconductor material 336. Additionally, openings 392 may be formed, e.g., via etching, in semiconductor layer 396 to form fins 394.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming a semiconductor structure, the method comprising:
    forming a set of openings within a substrate;
    forming an insulator layer within each opening in the set of openings;
    recessing the substrate between adjacent openings containing the insulator layer in the set of openings to form a set of insulator pillars on the substrate;
    forming sigma cavities within the recessed substrate between adjacent insulator pillars in the set of insulator pillars;
    filling the sigma cavities with a semiconductor material over the recessed substrate between adjacent insulator pillars to a thickness less than a height of the insulator pillars;
    recessing the set of insulator pillars to a height less than the height of the semiconductor material; and
    forming additional semiconductor material over the recessed set of insulator pillars such that the additional semiconductor material is grown laterally from the semiconductor material.

2. The method of claim 1, wherein the forming of the set of openings within the substrate includes:
    forming a hard mask over the substrate;
    patterning the hard mask to expose portions of the substrate; and
    removing the exposed portions of the substrate to create the set of openings.

3. The method of claim 1, wherein the semiconductor material includes a III-V material.

4. The method of claim 1, wherein the insulator layer includes at least one of: an oxide or a nitride.

5. The method of claim 1, wherein the filling of the sigma cavities with the semiconductor material includes growing the semiconductor material to a height less than a height of the insulator pillars.

6. The method of claim 1, further comprising:
    forming a set of semiconductor fins over the set of insulator pillars in a material grown above a level of the set of insulator pillars.

7. A method of forming a semiconductor structure, the method comprising:
    forming a set of insulator pillars on a substrate;
    forming a semiconductor material between adjacent insulator pillars of the set of insulator pillars, wherein a height of the semiconductor material is less than a height of the set of insulator pillars;
    recessing the set of insulator pillars to a thickness below the height of the semiconductor material; and
    forming additional semiconductor material over the recessed set of insulator pillars.

8. The method of claim 7, further comprising:
    forming sigma cavities within the substrate between adjacent insulator pillars in the set of insulator pillars after the forming of set of insulator pillars and prior to the forming of the semiconductor material between adjacent insulator pillars.

9. The method of claim 7, wherein the forming of the additional semiconductor material includes forming the additional semiconductor material laterally from the semiconductor material.

10. The method of claim 7, further comprising:
    after the forming of the semiconductor material and prior to the recessing of the set of insulator pillars, patterning a hard mask over the semiconductor material and exposing the set of insulator pillars; and
    removing the hard mask after the forming of the additional semiconductor material.

11. The method of claim 7, wherein the semiconductor material and the additional semiconductor material together have a thickness of approximately 100 nanometers to approximately 200 nanometers.

12. The method of claim 7, wherein the forming of the set of insulator pillars includes:
    forming a hard mask over the substrate;
    patterning the hard mask to expose portions of the substrate;
    removing the exposed portions of the substrate to create openings in the substrate;
    forming an insulator material in the substrate openings; and
    recessing the substrate to a height of a bottom surface of the insulator material.

* * * * *